United States Patent

Heinecke et al.

[11] 4,073,669
[45] Feb. 14, 1978

[54] PLASMA ETCHING

[75] Inventors: Rudolf August Herbert Heinecke; Geoffrey Laurence Ashcroft, both of Harlon, England

[73] Assignee: ITT Industries, Incorporated, New York, N.Y.

[21] Appl. No.: 681,664

[22] Filed: Apr. 29, 1976

[51] Int. Cl.² ............................................. C23F 1/02
[52] U.S. Cl. ................................. 156/643; 156/646; 204/192 E; 204/298; 252/79.1
[58] Field of Search .......... 204/129.1, 192 CE, 192 E, 204/298; 156/8, 18, 22, 345; 252/79.1

[56] References Cited

U.S. PATENT DOCUMENTS

| | | | |
|---|---|---|---|
| 3,620,957 | 11/1971 | Crawley et al. | 204/298 |
| 3,860,507 | 1/1975 | Vossen | 204/298 X |
| 3,975,252 | 8/1976 | Fraser et al. | 204/192 E |

Primary Examiner—William A. Powell
Attorney, Agent, or Firm—John T. O'Halloran; Peter C. Van Der Sluys

[57] ABSTRACT

Aluminum films on a semiconductor surface are etched in a carbon tetrachloride glow discharge. Typical etch rates are 2000-3000 A/min. The addition of 15% ammonia to the plasma prevents HCl formation when the etched material is exposed to air.

This process provides a more easily controlled process for the manufacture of high density integrated circuits.

5 Claims, 2 Drawing Figures

PLASMA ETCHING

BACKGROUND OF THE INVENTION

This invention relates to methods and arrangements for plasma etching aluminum films carried on a solid substrate.

Many semiconductor processing techniques involve the deposition of a metal, typically aluminum, film on the semiconductor surface followed by an etching process which selectively removes the metal so as to form an electrode or conductor pattern. This etching process is normally effected by masking the metal film with a photoresist material and then immersing the masked workpiece in a liquid etch. Although widely employed, such etch processes suffer from the disadvantage that gas bubbles formed on the metal surface during the etching process cause local inhibition of etching. Also liquid etches tend to undercut the metal film thus reducing the conductor track cross section.

SUMMARY OF THE INVENTION

It is an object of the present invention to provide a technique for plasma etching aluminum films while avoiding the above mentioned disadvantages.

According to a broad aspect of the invention, there is provided a method for selectively etching an aluminum film carried on a solid substrate, comprising: exposing the film to a glow discharge maintained in an atmosphere at least a major portion of which comprises carbon tetrachloride.

According to a further aspect of the invention, there is provided a method for selectively etching an aluminum film carried on a semiconductor substrate, comprising: selectively masking the aluminum film with a photoresist material; exposing the masked film to a radio-frequency glow discharge maintained in an atmosphere comprising carbon tetrachloride together with up to 15 volume percent ammonia; and stripping of the photoresist mask to obtain a finished semiconductor substrate carrying an aluminum conductor pattern thereon.

According to a further aspect of the invention, there is also provided a susceptor assembly for mounting an aluminum coated semiconductor substrate during plasma etching of the aluminum, comprising: a horizontally mounted conductive base plate adapted to be connected to earth; a dielectric plate mounted on said base plate; and a second conductive plate mounted on the dielectric plate so as to form a capacitive combination with the dielectric plate and the base plate.

The above and other objects of the invention will be better understood from the following detailed description taken in conjunction with the accompanying drawings, in which:

DESCRIPTION OF THE PREFERRED EMBODIMENT

Figure 1:
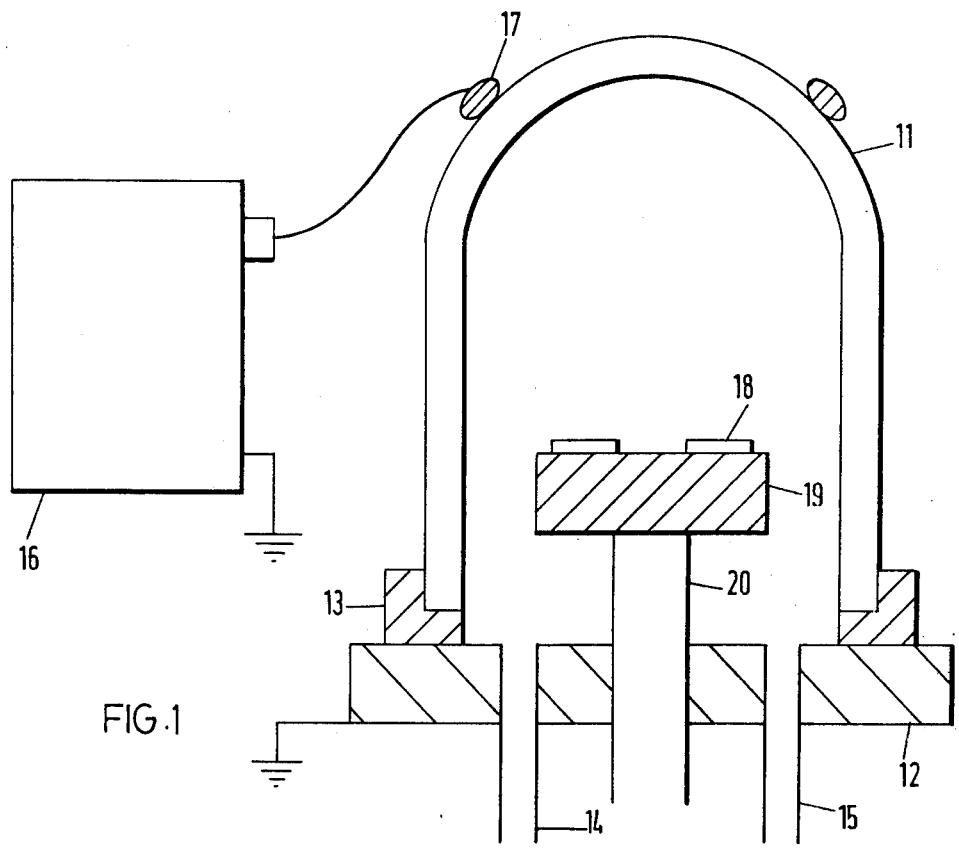
FIG. 1 is a part schematic of a glow discharge or plasma etching apparatus.
Figure 2:
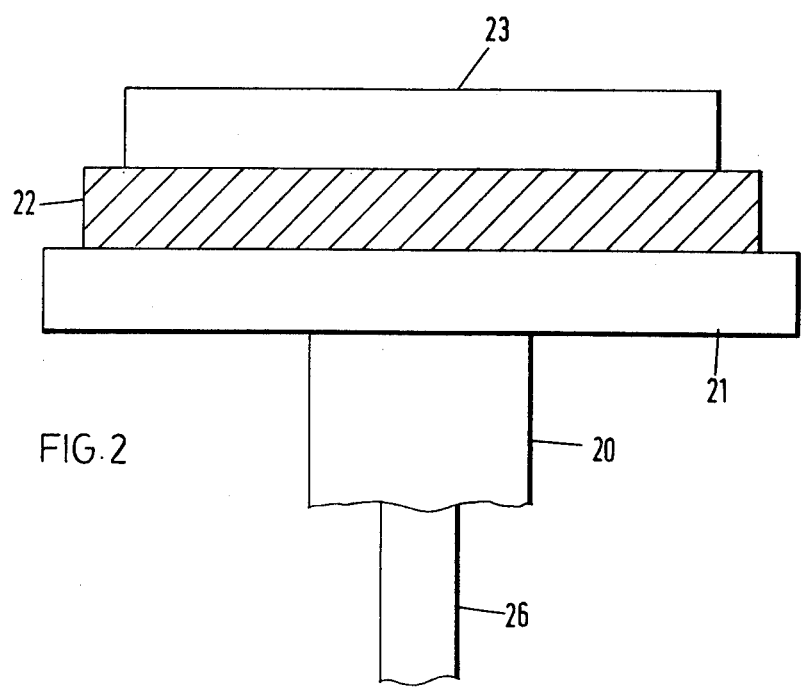
FIG. 2 is a cross-section of the susceptor assembly employed in the apparatus of FIG. 1.

Referring to the drawings, the plasma etching arrangement includes a bell jar 11 mounted on an earthed conductive plate 12 via a rubber or plastics gasket 13. The bell jar 11 is evacuated via an outlet pipe 14 and is supplied with carbon tetrachloride vapor via an inlet 15. Radio frequency power is supplied from a generator 16, operating at a nominal frequency of 1MHz, to a ring electrode 17 placed around the shoulders of the bell jar 11.

Aluminum coated semiconductor, e.g. silicon, slices 18 to be etched are placed on a susceptor assembly 19 mounted on a conductive earthed pillar 20. The susceptor 19 is constructed from a conductive base plate 21 on which is mounted a borosilicate glass plate 22, typically 6mm thick, and a second conductive plate 23 so as to form a capacitor construction. The conductive plates 21 and 23 may advantageously be made of stainless steel. The susceptor may also advantageously be provided with an inlet pipe 26 for carbon tetrachloride vapor thus allowing inlet 15 through the plate 12 to be dispensed with. This susceptor construction inhibits the formation of polymer fibres on the workpieces during the etch process.

The aluminum coated semiconductor slices 18 are prepared for etching by selective masking with a photoresist and are arranged on the upper plate 23 of the susceptor assembly 19. The bell jar is evacuated and back filled to a pressure between 0.03 and 0.3 torr with carbon tetrachloride vapor. The radio frequency generator is then switched on to strike and maintain a glow discharge around the susceptor. The exposed portions of the aluminum are etched by the plasma with substantially no undercutting at a rate of 2,000 to 3,000 A per minute.

When etching is completed the generator is switched off and the bell jar 11 is evacuated and back filled with dry air or nitrogen. The semiconductor slices 18 are removed and, after the photoresist mask material has been stripped off, are ready for further processing e.g. by encapsulation or by the attachment of discrete components.

In a particularly advantageous embodiment the carbon tetrachloride vapor used in the process may include up to 15 volume percent ammonia. If pure carbon tetrachloride is employed the finished workpieces sometimes show surface damage when exposed to air. It is thought that during the etching process chlorine compounds are formed on the photoresist surface which compounds, in contact with moist air, release free hydrogen chloride which then attacks the areas exposed by the etching.

The etching process may also be employed to selectively remove aluminum films from materials other than silicon. Thus, the aluminum may be deposited for example on silica coated silicon, silicon nitride on silicon, lithium niobate or quartz.

It is to be understood that the foregoing description of specific examples of this invention is made by way of example only and is not to be considered as a limitation on its scope.

What is claimed is:

1. A method for selectively etching an aluminum film carried on a semiconductor substrate, comprising:
   selectively masking the aluminum film with a photoresist material;
   exposing the masked film to a radio-frequency glow discharge maintained in an atmosphere comprising carbon tetrachloride together with up to 15 volume percent ammonia; and
   stripping of the photoresist mask to obtain a finished semiconductor substrate carrying an aluminum conductor pattern thereon.

2. A method according to claim 1 wherein the carbon tetrachloride atmosphere is maintained at a pressure between 0.03 and 0.3 torr.

3. A method according to claim 2 wherein the plasma etching stage is performed with the masked substrate mounted on a D.C. isolated conductive plate positioned in the plasma, and wherein said plate is capacitively coupled to earth.

4. A method according to claim 3 wherein the semiconductor material is silicon.

5. A method according to claim 4 wherein the aluminum is etched at a rate of 2,000 to 3,000 A per minute.

* * * * *

UNITED STATES PATENT AND TRADEMARK OFFICE
CERTIFICATE OF CORRECTION

PATENT NO. : 4,073,669
DATED : February 14, 1978
INVENTOR(S) : R.A. Heinecke; Geoffrey L. Asheroft It is certified that error appears in the above—identified patent and that said Letters Patent is hereby corrected as shown below:

Page 1, left-hand column, insert between items [22] and [51]:

--[30]   Foreign Application Priority Data
         September 18, 1975   Great Britain------38360/75--

Signed and Sealed this

Twelfth Day of January 1982

[SEAL]

Attest:

GERALD J. MOSSINGHOFF

*Attesting Officer*    *Commissioner of Patents and Trademarks*